US011011353B2

(12) United States Patent
Musselman et al.

(10) Patent No.: US 11,011,353 B2
(45) Date of Patent: *May 18, 2021

(54) SYSTEMS AND METHODS FOR PERFORMING EDGE RING CHARACTERIZATION

(71) Applicant: LAM RESEARCH CORPORATION, Fremont, CA (US)

(72) Inventors: Marcus Musselman, Oakland, CA (US); Andrew D. Bailey, III, Pleasanton, CA (US); Jon McChesney, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 691 days.

This patent is subject to a terminal disclaimer.

(21) Appl. No.: 15/403,786

(22) Filed: Jan. 11, 2017

(65) Prior Publication Data
US 2017/0287682 A1    Oct. 5, 2017

Related U.S. Application Data

(60) Provisional application No. 62/314,659, filed on Mar. 29, 2016.

(51) Int. Cl.
*H01J 37/32*    (2006.01)
*H01L 21/687*    (2006.01)
(Continued)

(52) U.S. Cl.
CPC ...... *H01J 37/32642* (2013.01); *H01J 37/321* (2013.01); *H01J 37/32183* (2013.01);
(Continued)

(58) Field of Classification Search
CPC .... C25D 21/12; C25D 17/001; C25D 17/004; C25D 17/06; H01L 21/67253;
(Continued)

(56) References Cited

U.S. PATENT DOCUMENTS

| | | |
|---|---|---|
| 5,660,673 A | 8/1997 | Miyoshi |
| 5,762,714 A | 6/1998 | Mohn et al. |

(Continued)

FOREIGN PATENT DOCUMENTS

| | | |
|---|---|---|
| CN | 102243977 A | 11/2011 |
| CN | 102315150 A | 1/2012 |

(Continued)

OTHER PUBLICATIONS

First Office Action dated Dec. 29, 2017 corresponding to Chinese Patent Application No. 201610032252.1, 12 pages.
(Continued)

*Primary Examiner* — Lee D Wilson
*Assistant Examiner* — Seahee Hong

(57) ABSTRACT

A substrate support in a substrate processing system includes an inner portion arranged to support a substrate, an edge ring surrounding the inner portion, and a controller. The controller at least one of raises the edge ring to selectively cause the edge ring to engage the substrate and lowers the inner portion to selectively cause the edge ring to engage the substrate. The controller determines when the edge ring engages the substrate and calculates at least one characteristic of the substrate processing system based on the determination of when the edge ring engages the substrate.

18 Claims, 5 Drawing Sheets

(51) Int. Cl.
  *H01L 21/68* (2006.01)
  *H01L 21/67* (2006.01)
(52) U.S. Cl.
  CPC ...... *H01L 21/67259* (2013.01); *H01L 21/681* (2013.01); *H01L 21/68735* (2013.01); *H01L 21/68742* (2013.01)
(58) Field of Classification Search
  CPC ............ H01L 21/68785; H01L 21/6833; H01J 37/32559; H01J 37/32577; H01J 37/32642; B25B 11/00; B23Q 5/00; B23Q 35/00; B23Q 1/03; B23Q 3/00; B23P 19/00
  USPC ............. 356/138; 269/55, 903, 21; 414/806; 118/728, 729; 156/345.51; 361/234
  See application file for complete search history.

(56) References Cited

U.S. PATENT DOCUMENTS

| | | | |
|---|---|---|---|
| 6,022,809 A | 2/2000 | Fan | |
| 6,044,534 A | 4/2000 | Seo et al. | |
| 6,206,976 B1 * | 3/2001 | Crevasse | C23C 16/45521 |
| | | | 118/500 |
| 6,589,352 B1 | 7/2003 | Yudovsky et al. | |
| 6,744,212 B2 | 6/2004 | Fischer et al. | |
| 6,896,765 B2 | 5/2005 | Steger | |
| 6,898,558 B2 | 5/2005 | Klekotka | |
| 7,968,469 B2 | 6/2011 | Collins et al. | |
| 8,999,106 B2 | 4/2015 | Liu et al. | |
| 9,011,637 B2 | 4/2015 | Yamamoto | |
| 9,142,391 B2 | 9/2015 | Yamamoto | |
| 2002/0071128 A1 | 6/2002 | Doan | |
| 2002/0072240 A1 * | 6/2002 | Koike | H01J 37/32642 |
| | | | 438/710 |
| 2003/0201069 A1 | 10/2003 | Johnson | |
| 2004/0031338 A1 * | 2/2004 | Chen | H01L 21/67259 |
| | | | 73/865.9 |
| 2004/0053428 A1 | 3/2004 | Steger | |
| 2004/0149389 A1 | 8/2004 | Fink | |
| 2005/0041238 A1 | 2/2005 | Ludviksson et al. | |
| 2008/0223873 A1 | 9/2008 | Chen et al. | |
| 2008/0236749 A1 | 10/2008 | Koshimizu et al. | |
| 2009/0056629 A1 | 3/2009 | Katz et al. | |
| 2009/0067954 A1 | 3/2009 | Lanee et al. | |
| 2009/0197423 A1 | 8/2009 | Koshimizu et al. | |
| 2010/0025369 A1 * | 2/2010 | Negishi | H01J 37/32642 |
| | | | 216/60 |
| 2011/0031111 A1 | 2/2011 | Kobayashi | |
| 2011/0287631 A1 | 11/2011 | Yamamoto | |
| 2012/0305184 A1 | 12/2012 | Singh et al. | |
| 2013/0106286 A1 | 5/2013 | Banna et al. | |
| 2013/0157388 A1 | 6/2013 | Grimbergen | |
| 2014/0213055 A1 | 7/2014 | Himori et al. | |
| 2014/0273460 A1 | 9/2014 | Reyland et al. | |
| 2015/0181684 A1 | 6/2015 | Banna et al. | |
| 2016/0039126 A1 * | 2/2016 | Tan | B29C 43/021 |
| | | | 264/40.5 |
| 2016/0211165 A1 | 7/2016 | McChesney et al. | |
| 2016/0211166 A1 | 7/2016 | Yan et al. | |
| 2017/0018407 A1 | 1/2017 | Kondo | |
| 2017/0236743 A1 * | 8/2017 | Severson | H01L 21/68735 |
| | | | 414/806 |
| 2017/0287753 A1 * | 10/2017 | Musselman | H01L 21/67259 |

FOREIGN PATENT DOCUMENTS

| | | |
|---|---|---|
| CN | 103730318 A | 4/2014 |
| CN | 104299929 A | 1/2015 |
| CN | 104752141 A | 7/2015 |
| CN | 104851832 A | 8/2015 |
| CN | 105336561 A | 2/2016 |
| JP | 2002176030 A | 6/2002 |
| JP | 2006173223 A | 6/2006 |
| JP | 2006186171 A | 7/2006 |
| JP | 2010034416 A | 2/2010 |
| JP | 2011210853 A | 10/2011 |
| JP | 2015201552 A | 11/2015 |
| KR | 20050008792 A | 1/2005 |
| KR | 100783062 B1 | 12/2007 |
| KR | 20080023569 A | 3/2008 |
| TW | 506234 B | 10/2002 |
| TW | 201207933 A | 2/2012 |
| TW | 201324653 A | 6/2013 |
| TW | 201436089 | 9/2014 |

OTHER PUBLICATIONS

First Office Action dated Aug. 2, 2018 corresponding to Chinese Patent Application No. 201710036188.9, 7 pages.
MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.
Notice of Reasons for Refusal corresponding to Japanese Patent Application No. 2017-6322 dated Mar. 30, 2021, 8 pages.

* cited by examiner

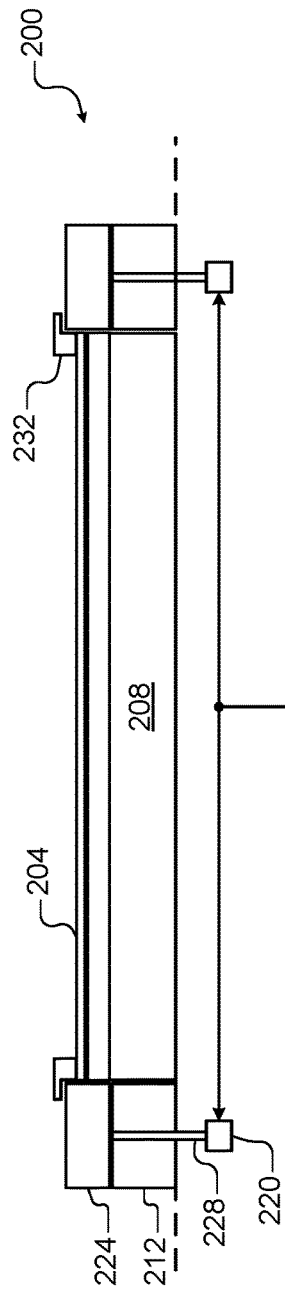
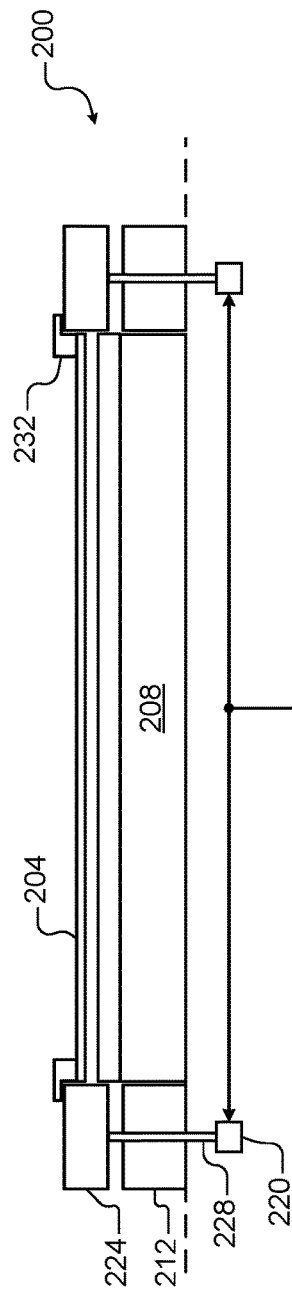
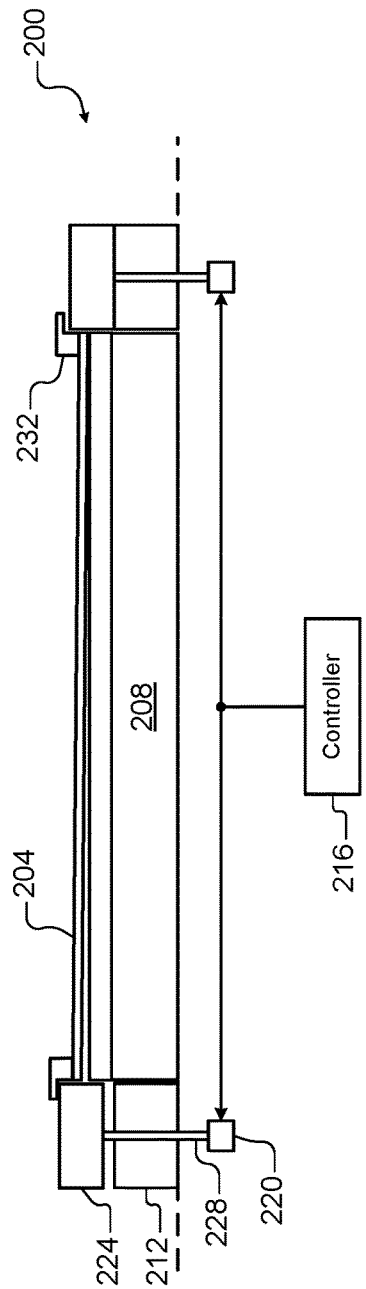
FIG. 2A
FIG. 2B
FIG. 2C

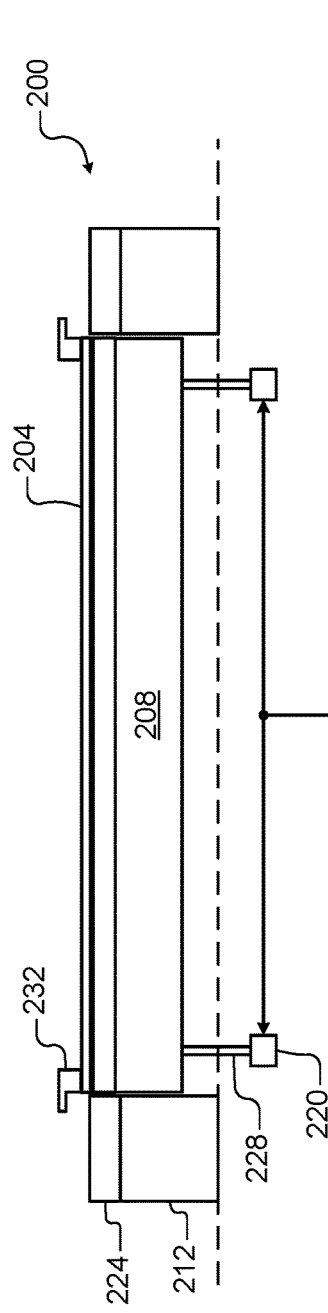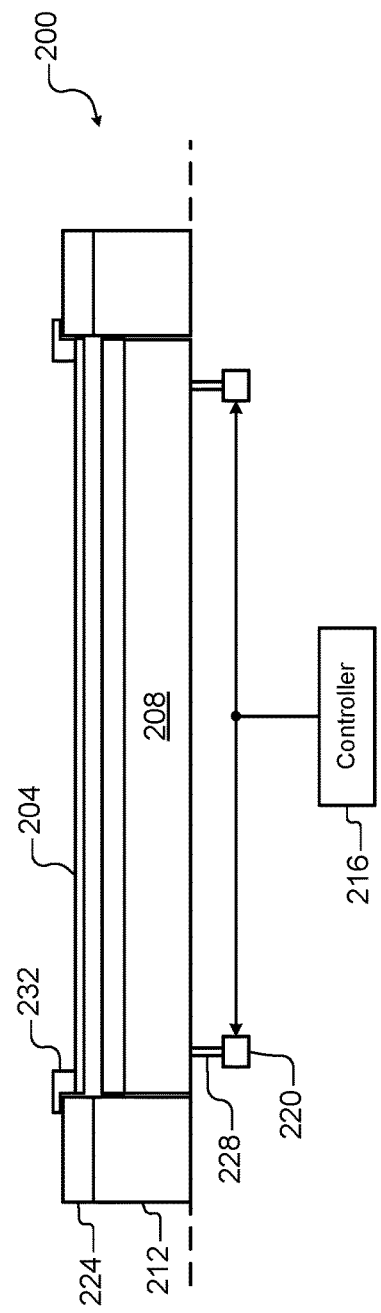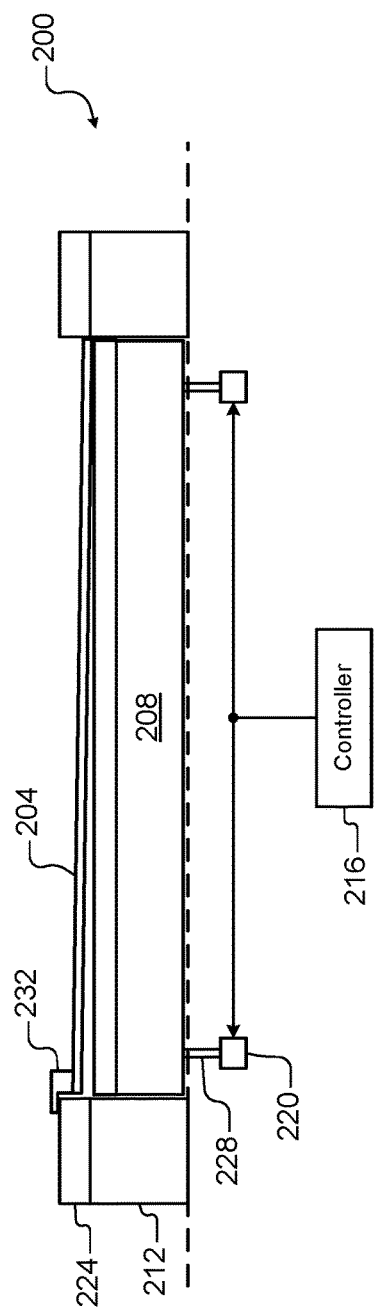

SYSTEMS AND METHODS FOR PERFORMING EDGE RING CHARACTERIZATION

CROSS-REFERENCE TO RELATED APPLICATIONS

This application claims the benefit of U.S. Provisional Application No. 62/314,659, filed on Mar. 29, 2016. The entire disclosures of the applications referenced above are incorporated herein by reference.

FIELD

The present disclosure relates to systems and methods for measuring an edge ring in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to etch film on a substrate such as a semiconductor wafer. The substrate processing system typically includes a processing chamber, a gas distribution device and a substrate support. During processing, the substrate is arranged on the substrate support. Different gas mixtures may be introduced into the processing chamber and radio frequency (RF) plasma may be used to activate chemical reactions.

The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc.

SUMMARY

A substrate support in a substrate processing system includes an inner portion arranged to support a substrate, an edge ring surrounding the inner portion, and a controller. The controller at least one of raises the edge ring to selectively cause the edge ring to engage the substrate and lowers the inner portion to selectively cause the edge ring to engage the substrate. The controller determines when the edge ring engages the substrate and calculates at least one characteristic of the substrate processing system based on the determination of when the edge ring engages the substrate.

A method of determining characteristics a substrate processing system includes arranging a test substrate on an inner portion of a substrate support. The test substrate includes a contact finger extending outward from an edge of the test substrate. The method further includes at least one of raising an edge ring surrounding the inner portion to cause an inner diameter of the edge ring to engage the contact finger and lowering the inner portion to cause the inner diameter of the edge ring to engage the contact finger, determining when the inner diameter of the edge ring engages the contact finger, and determining at least one characteristic of the substrate processing system based on the determination of when the inner diameter of the edge ring engages the contact finger.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A shows an example edge ring in a lowered position according to the present disclosure;

FIG. 2B shows an example edge ring in a raised position according to the present disclosure;

FIG. 2C shows an example edge ring in a tilted position according to the present disclosure;

FIG. 3A shows an example substrate support in a raised position according to the present disclosure;

FIG. 3B shows an example test wafer arranged on a substrate support in a lowered position according to the present disclosure;

FIG. 3C shows another example test wafer arranged on a substrate support in a lowered position according to the present disclosure;

In the drawings, reference numbers may be reused to identify similar and/or identical elements.

DETAILED DESCRIPTION

Figure 1:
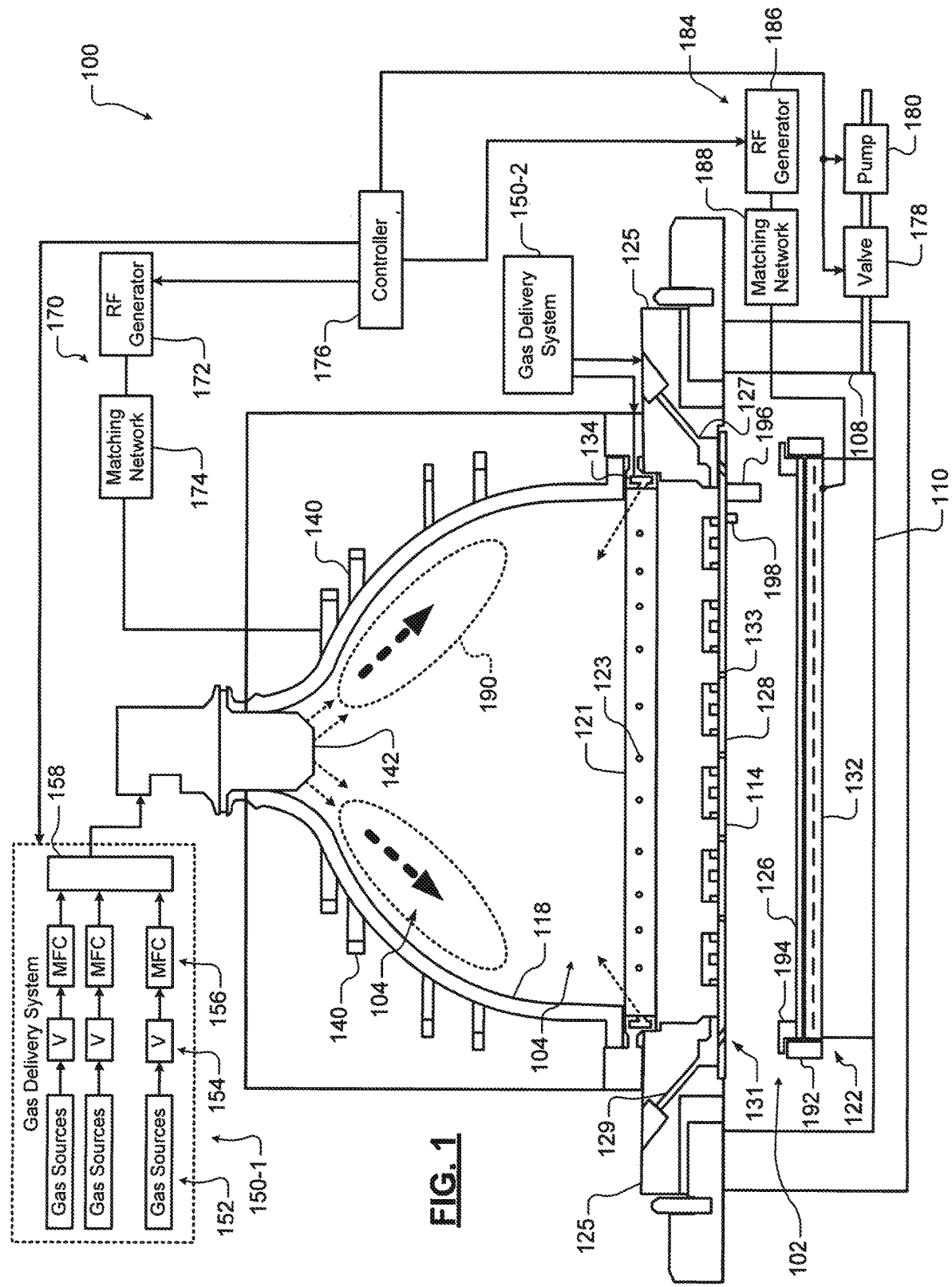
FIG. 1 is a functional block diagram of an example processing chamber according to the present disclosure.

A substrate support in a substrate processing chamber may include an edge ring for confining plasma to a volume above the substrate, protect the substrate support from erosion caused by the plasma, etc. For example, the edge ring may be arranged to control characteristics of a plasma sheath near and around the substrate and the edge ring to achieve a desired critical dimension uniformity (CDU). Various surfaces of the edge ring experience wear over time due to exposure to the plasma within the chamber, causing changes in dimensions of the edge ring. Consequently, the CDU of substrates processed within the chamber may be affected.

It is therefore desirable to periodically measure dimensions of the edge ring affected by wear to determine whether to replace or adjust the edge ring, preferably without opening the substrate processing chamber. Example methods for measuring dimensions of the edge ring include using a laser and photodiode to measure tilting of a substrate arranged on the substrate support, using a laser displacement sensor, etc.

Edge ring measurement systems and methods according to the principles of the present disclosure implement a moveable/adjustable edge ring (and/or an adjustable substrate support, chuck, pedestal, etc.) and a test or dummy wafer to measure dimensions of the edge ring. The edge ring may be moveable using, for example, one or more pins and associated actuators (e.g., a three degree of freedom, or 3DOF, parallel robot) for independently raising and lowering respective portions of the edge ring. The test wafer includes one or more contact fingers arranged around and extending outward from an edge of the test wafer.

An effective diameter of the test wafer (e.g., as defined by outer ends of the contact fingers) is greater than an inner diameter of the edge ring. Accordingly, the contact fingers contact an upper surface of the edge ring. In this manner, raising and lowering the edge ring correspondingly raises and lowers the test wafer, and the pins may be independently controlled to achieve a desired orientation (e.g., height, tilt, etc.) of the edge ring relative to the test wafer. In examples including an adjustable substrate support, the substrate support may be lowered to cause the contact fingers to contact the edge ring in a similar manner. In examples where the test wafer includes only one contact finger, the test wafer may be positioned (e.g., rotationally) such that the contact finger is aligned with a desired portion of the edge ring. Accordingly, raising the edge ring to engage the contact finger will cause the wafer to tilt differently based on characteristics of the edge ring at that position.

The substrate processing chamber may include a measurement device (e.g., a light measurement device such as a spectral reflectometer, or SR, a laser spectral reflectometer, or LSR, etc.) positioned to measure various characteristics of a wafer arranged on the substrate support. For example, the SR may be positioned directly above the substrate support to direct an SR signal downward at the wafer. A photodiode, charge-coupled device (CCD), or other sensing device is arranged to sense the SR signal reflected from the surface of the wafer. Characteristics of the reflected SR signal are indicative of various characteristics of the wafer. For example, the reflected SR signal may indicate whether the wafer is substantially flat relative to the substrate support (i.e., parallel to an upper surface of the substrate support), tilted, etc. Accordingly, if the edge ring is raised, the angle of the reflected SR signal will change as soon as the edge ring engages one or more of the contact fingers.

Conversely, if the wafer is raised from the substrate support using the edge ring, uneven wear in the edge ring will cause an angle of the reflected SR signal to differ from an expected angle (i.e., an angle corresponding to a wafer lying substantially flat on the substrate support). Similarly, if the wafer is intentionally tilted using the edge ring (e.g., by actuating only one pin to tilt the edge ring), the reflected SR signal will still indicate whether the tilt of the wafer corresponds to an expected tilt of the wafer.

In this manner, systems and methods described herein are configured to determine when the edge ring engages the contact fingers, and further determine wear on various portions of the edge ring. For example, respective geometries (e.g., contact surface profiles) of the contact fingers may determine which portion of the edge ring is measured. If the contact finger is arranged to contact an inner diameter of the edge ring, then contact between the contact finger and the edge ring may be indicative of wear on the inner diameter of the edge ring. Conversely, if the contact finger is arranged to contact a middle or outer diameter of the edge ring, then contact between the contact finger and the edge ring may be indicative of wear on the middle or outer diameter of the edge ring. Although described herein as an SR device, the principles of the present disclosure may be implemented using any measurement device configured to sense when the edge ring engages the test wafer and causes the test wafer to move, tilt, etc.

Referring now to FIG. 1, an example of a substrate processing chamber 100 for etching a layer (for example only, a tungsten, or W, layer) of a substrate according to the present disclosure is shown. While a specific substrate processing chamber is shown and described, the methods described herein may be implemented on other types of substrate processing systems.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114.

The upper chamber region 104 is defined by an upper surface of the gas distribution device 114 and an inner surface of a dome 118. In some examples, the dome 118 rests on a first annular support 121. In some examples, the first annular support 121 includes one or more spaced holes 123 for delivering process gas to the upper chamber region 104, as will be described further below. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to the one or more spaced holes 123.

The first annular support 121 may rest on a second annular support 125 that defines one or more spaced holes 127 for delivering process gas from a gas flow channel 129 to the lower chamber region 102. In some examples, holes 131 in the gas distribution device 114 align with the holes 127. In other examples, the gas distribution device 114 has a smaller diameter and the holes 131 are not needed. In some examples, the process gas is delivered by the one or more spaced holes 127 in a downward direction towards the substrate at an acute angle relative to the plane including the gas distribution device 114, although other angles/directions may be used.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate 132, an optional cooling plate with fluid channels, and one or more sensors (not shown), although any other suitable substrate support temperature control system may be used.

In some examples, the gas distribution device 114 includes a showerhead (for example, a plate 128 having a plurality of spaced holes 133). The plurality of spaced holes 133 extend from the upper surface of the plate 128 to the lower surface of the plate 128. In some examples, the spaced holes 133 have a diameter in a range from 0.4" to 0.75" and the showerhead is made of a conducting material such as aluminum or a non-conductive material such as ceramic with an embedded electrode made of a conducting material.

One or more inductive coils 140 are arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels 129 and/or 134 (in addition to or instead of etch gas from the gas injector 142).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels 129 and 134 and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the chamber using the gas injector 142 (and/or holes 123) and plasma is confined within the dome 118 using the gas distribution device 114.

Confining the plasma in the dome 118 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the dome 118. Most of ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

The substrate support 122 includes an edge ring 192. The edge ring 192 according to the principles of the present disclosure is moveable (e.g., moveable upward and downward in a vertical direction) relative to the substrate 126, and/or the substrate support 122 is moveable upward and downward. For example, the edge ring 192 and/or the substrate support 122 may be controlled via one or more actuators responsive to the controller 176 as described below in more detail.

The substrate 126 includes one or more contact fingers 194 positioned to engage the edge ring 192. For example, raising and lowering the edge ring 192 and/or the substrate support 122 selectively causes the edge ring 192 to engage the contact fingers 194 as described below in more detail. An SR device 196 is arranged to direct an SR signal at a surface of the substrate 126. The SR signal is reflected and received by a sensor (e.g., a photodiode) 198. Dimensions of the edge ring 192 (e.g., as affected by wear) may be calculated using a height of the edge ring 192 (and/or the substrate support 122) when the edge ring 192 makes contact with the contact fingers 194 (e.g., as indicated by the reflected SR signal).

Referring now to FIGS. 2A, 2B, and 2C, example substrate supports 200 having respective test substrates or wafers 204 arranged thereon according to the principles of the present disclosure are shown. The substrate supports 200 may each include a base or pedestal having an inner portion (e.g., corresponding to an ESC) 208 and an outer portion 212. In examples, the inner portion 208 may be independent from, and moveable in relation to, the outer portion 212 (i.e., in examples where the inner portion 208 is configured to be raised and/or lowered). A controller 216 communicates with one or more actuators 220 to selectively raise and lower edge ring 224. For example only, the edge ring 224 is shown in a fully lowered position in FIG. 2A and in example raised positions in FIGS. 2B and 2C. As shown in the examples, the actuators 220 correspond to pin actuators configured to selectively extend and retract pins 228 in a vertical direction. Other suitable types of actuators may be used in other examples. For example, the actuators 220 may correspond to motors configured to engage threads of the respective pins 228 to raise and lower the pins 228 in a stepwise fashion. For example only, the edge ring 224 corresponds to a ceramic or quartz edge ring.

The test wafer 204 includes one or more contact fingers 232. Although two contact fingers 232 are shown, in examples the test wafer 204 may include one, two, three, or more contact fingers 232. In FIG. 2B, the controller 216 is shown communicating with the actuators 220 to raise the entire edge ring 224. For example, the controller 216, actuators 220, and pins 228 may be configured such that only the entire edge ring 224 is raised and lowered, or the controller 216 may be configured to control the pins 228 individually. Accordingly, the test wafer 204 is substantially flat with respect to (i.e., parallel to) the substrate support 200. Conversely, in FIG. 2C, the controller 216 is shown communicating with only one of the actuators 220 to raise respective one of the pins 228 and only a portion of the edge ring 224. Accordingly, the test wafer 204 is tilted with respect to the substrate support 200.

In examples where the substrate support 200 only includes one of the actuators 220 and the respective pin 228, the test wafer 204 can be rotated and arranged in different positions to align the contact finger 232 with different portions of the edge ring 224. In this manner, the height of the edge ring 224 when the edge ring 224 engages the contact finger 232 is indicative of dimensions (e.g., wear) of the portion of the edge ring 224 aligned with the contact finger 232.

In another example as shown in FIGS. 3A, 3B, and 3C, the absolute height of the edge ring 224 (and/or the outer portion 212 that the edge ring 224 is mounted on) may be fixed relative to a bottom surface of the chamber. Instead, the inner portion 208 (e.g., the ESC) is moveable relative to the edge ring 224. Accordingly, the controller 216 may communicate with the actuators 220 to raise and lower the inner portion 208 relative to the edge ring 224 to adjust the height of the edge ring 224 relative to the substrate support 200. The inner portion 208 is shown in a raised position in FIG. 3A and in example lowered positions in FIGS. 3B and 3C. Accordingly, in examples where the test wafer 204 includes a plurality of the contact fingers 232 (e.g., as shown in FIG. 3B), the entire test wafer 204 is supported by the edge ring 224 and is substantially flat with respect to (i.e., parallel to) the substrate support 200. Conversely, in examples where the test wafer 204 only includes only one of the contact fingers 232 (e.g., as shown in FIG. 3C), a portion of the test wafer 204 corresponding to the contact finger 232 is supported by the edge ring 224, and the test wafer 204 is tilted with respect to the substrate support 200. The test wafer 204 can be rotated and arranged in different positions to align the contact finger 232 with different portions of the edge ring 224.

In the above examples, the respective raised and lowered heights of the edge ring 224 and the inner portion 208 (and the corresponding orientation or tilt of the test wafer 204 relative to the substrate support 200) are shown only for illustrative purposes. In operation, the edge ring 224 may be raised only until the edge ring 224 engages one or more of the contact fingers 232, thereby changing characteristics of the reflected SR signal. Similarly, the inner portion 208 may be lowered only until the one or more of the contact fingers 232 engage the edge ring 224, thereby changing characteristics of the reflected SR signal.

In this manner, the controller 216 is configured to monitor the characteristics of the reflected SR signal to detect when the edge ring 224 engages the contact finger 232 (or vice versa), determine a first height of the edge ring 224 (and/or the inner portion 208) where the edge ring 224 engages the contact finger 232, determine a difference between the first height and a height corresponding to a new (i.e., unworn, optimal, etc.) edge ring, and calculate dimensions of the edge ring 224 based on the difference. Accordingly, as the edge ring 224 wears over time, changes in the upper surface of the edge ring 224 can be calculated, and the edge ring 224 (and/or the inner portion 208) can be positioned to compensate for the wear. For example, if the controller 216 calculates that a thickness of an inner diameter of the edge ring 224 is reduced by 0.X millimeters (e.g., on average around the circumference of the edge ring 224), the controller 216 can raise the edge ring 224 by 0.X millimeters during processing of a substrate. Further, the controller 216 may determine (and indicate to a user via an LED, graphical interface, etc.) when the edge ring 224 requires maintenance, replacement, etc. The controller 216 can perform the measurement of the edge ring 224 dimensions via the above methods periodically, when prompted by a user, etc.

Figure 4A:
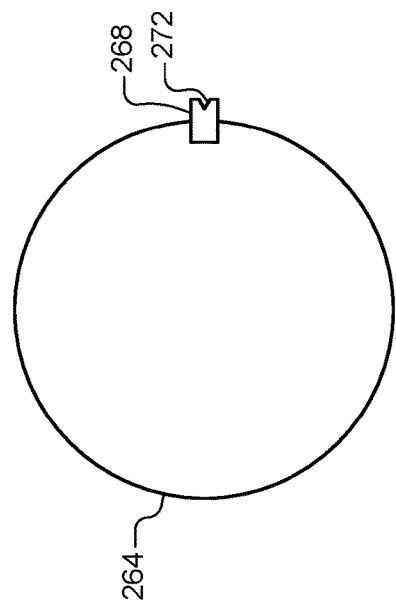
FIGS. 4A and 4B are plan views of example test wafers according to the present disclosure.
Figure 4B:
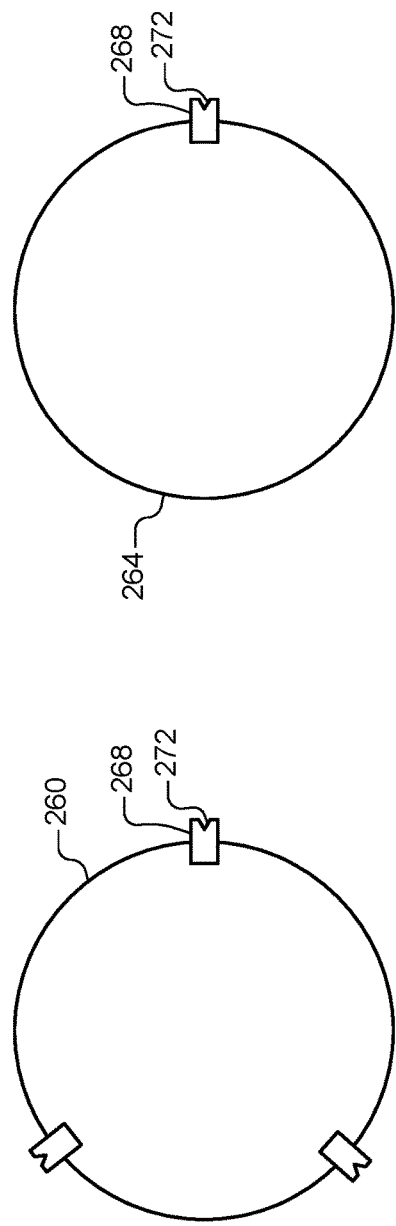

FIGS. 4A and 4B show plan views of example test wafers 260 and 264. In FIG. 4A, the test wafer 260 includes a plurality (e.g., three) contact fingers 268. In FIG. 4B, the test wafer 264 includes only one of the contact fingers 268. One or more of the contact fingers 268 may include a notch 272. The notch 272 may be used to position the test wafers 260 and 264 with a desired alignment with respect to the substrate support. For example, the position of the test wafers 260 and 264 can by determined by detecting the notch 272 (e.g., using a camera or other image sensing device) and calculating the alignment of the test wafers 260 and 264 accordingly.

Figure 5A:
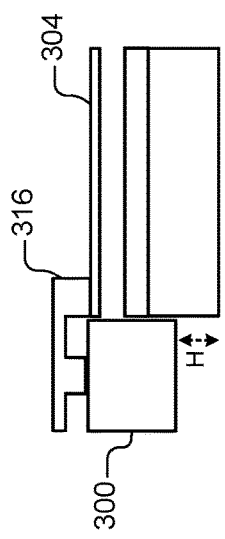
FIGS. 5A and 5B illustrate a contact finger having a first geometry according to the present disclosure.
Figure 5B:
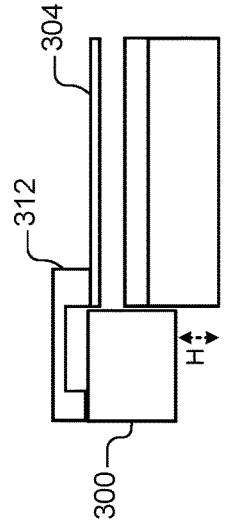
Figure 6A:
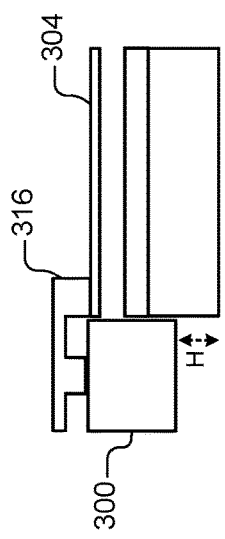
FIGS. 6A and 6B illustrate a contact finger having a second geometry according to the present disclosure.
Figure 6B:
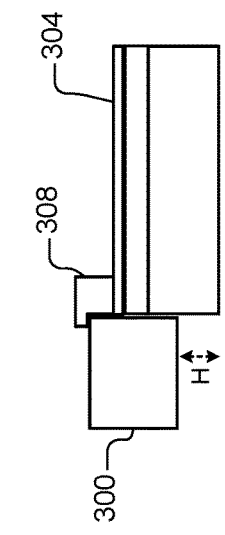
Figure 7A:
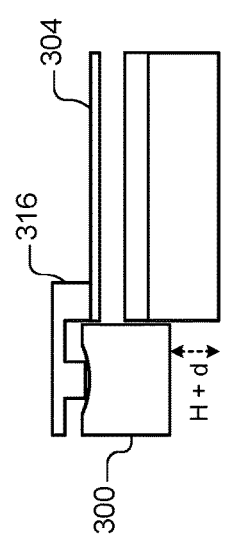
FIGS. 7A and 7B illustrate a contact finger having a third geometry according to the present disclosure.
Figure 7B:
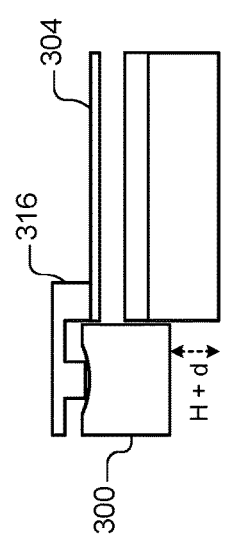

FIGS. 5A and 5B, 6A and 6B, and 7A and 7C show example edge rings 300 and test wafers 304. FIGS. 5A, 6A, and 7A illustrate heights H of the edge rings 300 prior to the edge rings 300 experiencing wear. FIGS. 5A, 6A and 7A illustrate heights H plus an offset d to compensate for respective wear of the edge rings 300. For example H+d corresponds to a respective height of the edge rings 300 when the edge rings 300 were determined (e.g., using the controller 216 and a reflected SR signal) to engage the contact fingers 308, 312, and 316. The contact fingers 308, 312, and 316 have different geometries (i.e., contact surface profiles) for measuring dimensions of the edge rings 300. In FIGS. 5A and 5B, the contact finger 308 is configured to engage an inner diameter of the edge ring 300. As shown in FIG. 3B, as the inner diameter of the edge ring 300 wears over time, the edge ring 300 engages the contact finger 308 at a different height. Accordingly, the edge ring 300 can be raised to determine an amount of wear (and corresponding changes in dimensions) to the inner diameter of the edge ring 300, and to achieve a desired relationship between the upper surface of the edge ring and a wafer being processed. Conversely, the contact finger 312 is configured to engage an outer diameter of the edge ring 300, and the contact finger 316 is configured to engage a middle diameter of the edge ring 300. In this manner, dimensions of different portions of the edge ring 300 can be measured.

Figure 8:
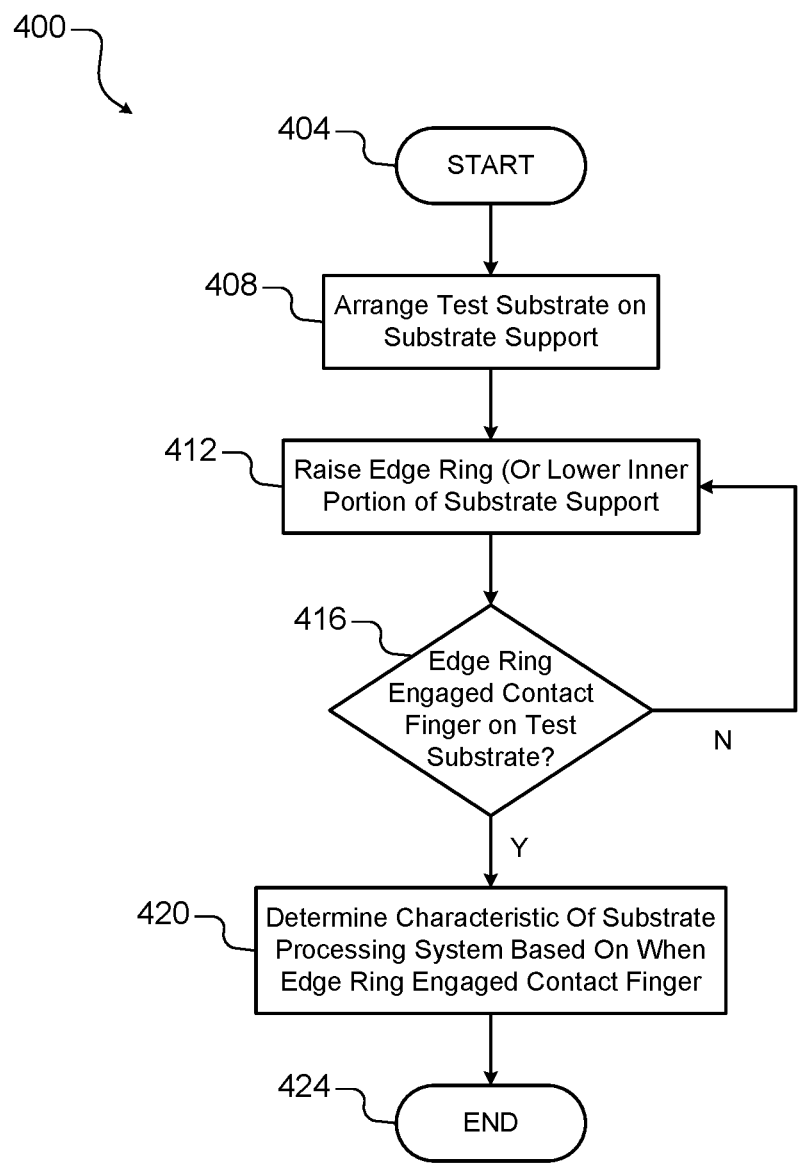
FIG. 8 illustrates steps of an example method for measuring dimensions of an edge ring according to the present disclosure.

Referring now to FIG. 8, an example method 400 for measuring dimensions of an edge ring according to the present disclosure begins at 404. At 408, a test substrate is arranged on a substrate support. For example, the test substrate includes a contact finger as described above with respect to FIGS. 1-7, and the contact finger extends above an edge ring of the substrate support. At 412, the edge ring is raised (or, in some examples, an inner portion of the substrate support is lowered). At 416, the method 400 (e.g., the controller 216) determines whether the edge ring (e.g., an inner diameter of the edge ring) engaged the contact finger. For example, the controller 216 determines whether the edge ring engaged the contact finger based on a signal reflected from a surface of the test substrate. If true, the method 400 continues to 420. If false, the method 400 continues to 412.

At 420, the method 400 (e.g., the controller 216) determines at least one characteristic of the substrate processing system based on when the edge ring engaged the contact finger. For example, the controller 216 calculates wear of the edge ring based on a position/height of the edge ring (or the inner portion of the substrate support in examples where the inner portion is lowered) when the edge ring engaged the contact finger, an overall amount the edge ring was raised, etc. The method 400 ends at 424.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support in a substrate processing system, the substrate support comprising:

an inner portion arranged to support a substrate;
an edge ring surrounding the inner portion; and
a controller configured to
- at least one of (i) raise the edge ring to selectively cause the edge ring to engage the substrate and (ii) lower the inner portion to selectively cause the edge ring to engage the substrate,
- determine when the edge ring engages the substrate in response to a measurement signal indicating that the edge ring has engaged the substrate, and
- calculate at least one characteristic of the substrate processing system based on the determination of when the edge ring engages the substrate.

2. The substrate support of claim 1, wherein, to determine when the edge ring engages the substrate, the controller is further configured to determine at least one of an amount the edge ring was raised and an amount the inner portion was lowered to cause the edge ring to engage the substrate.

3. The substrate support of claim 1, wherein the at least one characteristic is a dimension of the edge ring.

4. The substrate support of claim 1, further comprising the substrate, wherein the substrate includes at least one contact finger extending outward from an edge of the substrate, and wherein the at least one contact finger is arranged to engage the edge ring.

5. The substrate support of claim 4, wherein the contact finger is arranged to engage an inner diameter of the edge ring.

6. The substrate support of claim 1, wherein, to determine when the edge ring engages the substrate, the controller is configured to monitor a signal reflected from a surface of the substrate using the measurement signal.

7. The substrate support of claim 1, wherein, to calculate the at least one characteristic of the substrate processing system, the controller configured to determine at least one of an amount the edge ring was raised and an amount the inner portion was lowered to cause the edge ring to engage the substrate.

8. The substrate support of claim 1, further comprising:
a plurality of pins positioned to support the edge ring; and
a plurality of actuators responsive to the controller and arranged to selectively raise and lower respective ones of the plurality of pins.

9. The substrate support of claim 1, further comprising:
at least one actuator responsive to the controller and arranged to selectively raise and lower the inner portion.

10. A method of determining characteristics a substrate processing system, the method comprising:
- arranging a test substrate on an inner portion of a substrate support, wherein the test substrate includes a contact finger extending outward from an edge of the test substrate;
- at least one of (i) raising an edge ring surrounding the inner portion to cause an inner diameter of the edge ring to engage the contact finger and (ii) lowering the inner portion to cause the inner diameter of the edge ring to engage the contact finger;
- determining when the inner diameter of the edge ring engages the contact finger in response to a measurement signal indicating that the inner diameter of the edge ring has engaged the contact finer of the substrate; and
- determining at least one characteristic of the substrate processing system based on the determination of when the inner diameter of the edge ring engages the contact finger.

11. The method of claim 10, wherein determining when the inner diameter of the edge ring engages the substrate includes determining at least one of an amount the edge ring was raised and an amount the inner portion was lowered to cause the inner diameter of the edge ring to engage the substrate.

12. The method of claim 10, wherein the at least one characteristic is a dimension of the edge ring.

13. The method of claim 10, wherein the substrate includes at least one contact finger extending outward from an edge of the substrate, and wherein the at least one contact finger is arranged to engage the edge ring.

14. The method of claim 13, wherein the contact finger is arranged to engage an inner diameter of the edge ring.

15. The method of claim 10, wherein determining when the edge ring engages the substrate includes monitoring a signal reflected from a surface of the substrate using the measurement signal.

16. The method of claim 10, wherein calculating the at least one characteristic of the substrate processing system includes determining at least one of an amount the edge ring was raised and an amount the inner portion was lowered to cause the edge ring to engage the substrate.

17. The method of claim 10, wherein raising the edge ring includes raising the edge ring using a plurality of pins positioned to support the edge ring and a plurality of actuators arranged to selectively raise and lower respective ones of the plurality of pins.

18. The method of claim 10, wherein lowering the inner portion includes lowering the inner portion using at least one actuator arranged to selectively raise and lower the inner portion.

* * * * *